United States Patent
Kargl et al.

(10) Patent No.: US 8,159,289 B2
(45) Date of Patent: Apr. 17, 2012

(54) CHIP CARD HAVING AN ADJUSTABLE DEMODULATION UNIT

(75) Inventors: Walter Kargl, Graz (AT); Thomas Leutgeb, Lieboch (AT); Albert Missoni, Graz (AT); Richard Sbuell, Graz (AT)

(73) Assignee: Infineon Technologies AG, Neubiberg (DE)

( * ) Notice: Subject to any disclaimer, the term of this patent is extended or adjusted under 35 U.S.C. 154(b) by 399 days.

(21) Appl. No.: 12/556,659

(22) Filed: Sep. 10, 2009

(65) Prior Publication Data

US 2010/0060351 A1    Mar. 11, 2010

(51) Int. Cl.
*H03D 1/00*   (2006.01)
(52) U.S. Cl. .......................................... 329/347; 329/363
(58) Field of Classification Search ................... 329/347, 329/363
See application file for complete search history.

(56) References Cited

U.S. PATENT DOCUMENTS

| | | | |
|---|---|---|---|
| 7,971,794 B2* | 7/2011 | Leutgeb et al. | 235/492 |
| 2008/0224766 A1* | 9/2008 | Yamazaki et al. | 329/347 |
| 2009/0309652 A1* | 12/2009 | Kranabenter | 329/347 |

FOREIGN PATENT DOCUMENTS

DE       69903609 T2    6/2003

\* cited by examiner

*Primary Examiner* — Joseph Chang
(74) *Attorney, Agent, or Firm* — Murphy, Bilak & Homiller, PLLC

(57) ABSTRACT

The present invention shows a contactless chip card comprising a controllable demodulation unit for demodulating an amplitude-modulated carrier signal, a measuring unit for determining a degree of modulation of the modulated carrier signal, and a control unit for controlling the demodulation unit on the basis of the determined degree of modulation of the carrier signal.

5 Claims, 1 Drawing Sheet

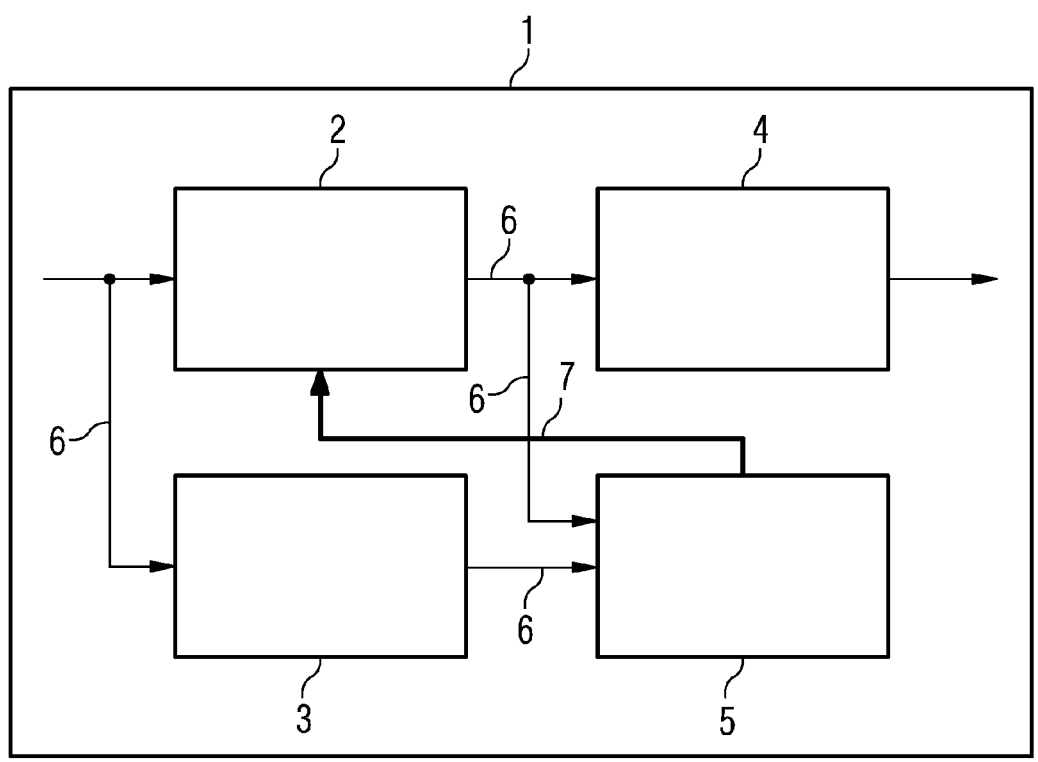

CHIP CARD HAVING AN ADJUSTABLE DEMODULATION UNIT

PRIORITY CLAIM

The present application claims the benefit of German Patent Application No. 102008046711.1, filed Sep. 11, 2008, which is incorporated by reference herein in its entirety.

BACKGROUND

The present invention relates to a contactless chip card having an adjustable demodulation unit for demodulating an amplitude-modulated carrier signal and to a method for controlling an adjustable demodulation unit.

Contactless IC (Integrated Circuit) cards, so-called contactless chip cards or smart cards, are usually operated in an electromagnetic field provided by a read/write unit.

The read/write unit usually provides a standardized carrier frequency of 13.56 MHz in the electromagnetic field. On the one hand, the carrier frequency provided uses induction to supply the contactless chip card with energy needed for the operation of the latter and, on the other hand, uses the execution of a communication protocol to ensure communication between the read/write unit and the contactless chip card.

If the contactless chip card is in the electromagnetic field provided by the read/write unit, it communicates with the read/write unit by amplitude-modulating at least one parameter of the carrier frequency. In this case, the degree of modulation of an amplitude-modulated carrier frequency is usually somewhere in the range between 6% and 30% and is then also referred to as the modulation index. On account of the wide range of possible modulation indices, problems of compatibility with conventional demodulation circuits may arise. Increasing demands on demodulation units usually result in demodulation circuits which are becoming more and more complex.

SUMMARY

Therefore, the present invention is based on the object of providing an adjustable demodulation unit by means of a simple and cost-effective circuit arrangement.

This object is achieved by means of the features of independent claims 1 and 5. The dependent claims each describe advantageous refinements of the present invention.

A contactless chip card according to the invention comprises an adjustable demodulation unit for demodulating a received amplitude-modulated carrier signal, a measuring unit for determining a degree of modulation of the carrier signal, and a control unit for controlling the demodulation unit on the basis of the determined degree of modulation of the carrier signal. The practice of determining the degree of modulation makes it possible to adapt the demodulation unit to a so-called modulation index, in particular.

In a contactless chip card, the control unit is set up to control the demodulation unit at a predetermined time.

In a contactless chip card, the control unit can be set up in such a manner that the control unit can adapt the degree of modulation of the demodulation unit to the degree of modulation of the amplitude-modulated carrier signal on the basis of the determined degree of modulation.

In a contactless chip card, the demodulation unit can be adjusted on the basis of the degree of modulation determined by the control unit in such a manner that only a partial region of the modulated carrier signal can be demodulated.

In an inventive method for controlling a demodulation unit for demodulating an amplitude-modulated carrier signal, the following steps are carried out: a measuring unit determines a degree of modulation of an amplitude-modulated carrier signal and transmits the degree of modulation to a control unit, the control unit evaluates the determined degree of modulation and controls the demodulation unit on the basis of the determined degree of modulation of the amplitude-modulated carrier signal.

BRIEF DESCRIPTION OF THE DRAWINGS

An exemplary embodiment of the invention is illustrated in FIG. 1 and is explained below.

FIG. 1 illustrates an advantageous refinement of an adjustable demodulation unit for demodulating an amplitude-modulated carrier signal.

DETAILED DESCRIPTION

FIG. 1 illustrates an embodiment of a contactless chip card 1 that includes a circuit having a demodulation unit 2, a unit for determining the degree of modulation 3, a decoding unit 4 and an evaluation and control unit 5. The demodulation unit 2 and the unit for determining the degree of modulation 3 are provided with an amplitude-modulated signal. The unit for determining the degree of modulation 3 determines the degree of modulation of the amplitude-modulated signal (this may be the modulation index or the modulation depth) and provides the evaluation and control unit 5 with this degree of modulation using a signal line 6. The evaluation and control unit 5 is connected to the demodulation unit 2 by means of a control line 7. The evaluation and control unit 5 determines the time at which the degree of modulation of the demodulation unit 2 is adapted to the amplitude-modulated signal and then sends a control signal to the demodulation unit 2. The demodulation unit 2 can be adapted to the amplitude-modulated signal at the beginning of the demodulation phase of the demodulation unit 2 or at predetermined times in which the contactless chip card is in the transmitting/receiving mode. In the advantageous refinement of the invention in FIG. 1, the demodulation unit 2 can be adjusted by the control unit 5 on the basis of the degree of modulation determined by the control unit 5 in such a manner that only a partial region of the modulated carrier signal can be demodulated. The adjustable demodulation unit 2 can therefore cover a virtually unrestricted range of the degree of modulation of a carrier signal by virtue of the fact that it can be adjusted in such a manner that it covers arbitrarily adjustable subsections of the degree of modulation like a window section. The advantageous refinement of an adjustable demodulation unit for demodulating an amplitude-modulated carrier signal, as shown in FIG. 1, can be used, in particular, in the demodulation of amplitude shift keying modulated signals.

LIST OF REFERENCE SYMBOLS

1=Contactless chip card
2=Demodulation unit
3=Measuring unit for determining the degree of modulation
4=Decoding unit
5=Evaluation and control unit
6=Signal line
7=Control line

The invention claimed is:
1. A contactless chip card comprising an adjustable demodulation unit for demodulating a received amplitude- modulated carrier signal, a measuring unit for determining a degree of modulation of the carrier signal, and a control unit for controlling the demodulation unit on the basis of the determined degree of modulation of the carrier signal.

2. The contactless chip card as claimed in claim 1, wherein the control unit is set up to control the demodulation unit at predetermined times.

3. The contactless chip card as claimed claim 1, wherein the control unit is set up in such a manner that the control unit can adapt a degree of modulation of the demodulation unit to the degree of modulation of the amplitude-modulated carrier signal on the basis of the determined degree of modulation.

4. The contactless chip card as claimed in claim 1, wherein the demodulation unit is able to be adjusted by the control unit on the basis of the degree of modulation determined by the control unit in such a manner that only a partial region of the modulated carrier signal can be demodulated.

5. A method for controlling a demodulation unit for demodulating an amplitude-modulated carrier signal, in which method a measuring unit determines a degree of modulation of the amplitude-modulated carrier signal and forwards the determined degree of modulation to a control unit, the control unit evaluates the determined degree of modulation and controls the demodulation unit on the basis of the determined degree of modulation.

* * * * *